(12) United States Patent
Horie

(10) Patent No.: US 7,474,039 B2
(45) Date of Patent: Jan. 6, 2009

(54) ELECTRONIC MODULE INCLUDING PIEZOELECTRIC DEVICE

(75) Inventor: Kyo Horie, Chigasaki (JP)

(73) Assignee: Epson Toyocom Corporation, Tokyo (JP)

( * ) Notice: Subject to any disclaimer, the term of this patent is extended or adjusted under 35 U.S.C. 154(b) by 0 days.

(21) Appl. No.: 11/808,691

(22) Filed: Jun. 12, 2007

(65) Prior Publication Data

US 2007/0290578 A1  Dec. 20, 2007

(30) Foreign Application Priority Data

Jun. 16, 2006  (JP) .............................. 2006-167342

(51) Int. Cl.
*H01L 41/08* (2006.01)
(52) U.S. Cl. ....................... 310/348; 310/340; 310/344; 331/158

(58) Field of Classification Search ................. 310/340, 310/344, 348; 331/158
See application file for complete search history.

(56) References Cited

U.S. PATENT DOCUMENTS

| | | | | |
|---|---|---|---|---|
| 5,571,363 | A * | 11/1996 | Brosig et al. ................. | 156/292 |
| 7,023,288 | B2 * | 4/2006 | Takanashi et al. ........ | 331/108 D |
| 2004/0113708 | A1 * | 6/2004 | Takanashi et al. ........... | 331/158 |
| 2005/0040904 | A1 * | 2/2005 | Sakurai ...................... | 331/176 |
| 2006/0170305 | A1 * | 8/2006 | Ohshima et al. ............ | 310/311 |
| 2007/0030084 | A1 * | 2/2007 | Sakurai ...................... | 331/176 |
| 2007/0228892 | A1 * | 10/2007 | Koyama et al. ............. | 310/348 |

FOREIGN PATENT DOCUMENTS

JP  A 2005-175848  6/2005

* cited by examiner

*Primary Examiner*—Jaydi SanMartin
(74) *Attorney, Agent, or Firm*—Oliff & Berridge, PLC

(57) ABSTRACT

An electronic module, comprises: a circuit board; a piezoelectric device having a lid, the piezoelectric device being mounted on the circuit board; and an electronic component mounted on the circuit board. The electronic component includes an adjustment terminal for at least one of adjusting and inspecting an electrical characteristic thereof. The lid is electrically conducted to the adjustment terminal.

8 Claims, 5 Drawing Sheets

ELECTRONIC MODULE INCLUDING PIEZOELECTRIC DEVICE

BACKGROUND

1. Technical Field

The present invention relates to an electronic module including a piezoelectric device.

2. Related Art

Modularizing components on a function-by-function basis has been increasingly employed in the market of small information apparatuses such as hard disk drives (HDDs), mobile computers, and IC cards, and mobile communication apparatuses such as cellular phones, automobile telephones, and paging systems, taking assembly, maintenance, and handling of electrical components into consideration.

FIG. 9 shows an electronic module 1, an example of related art disclosed in JP-A-2005-175848, in which components are packaged as a module.

In the electronic module 1, electronic components such as a piezoelectric oscillator 3, a battery pack 4, and a semiconductor element 5 are mounted on a circuit board 2. Each component is covered by a separation plate 6 so as to be protected from being adversely affected by external environment.

Also, in the electronic module 1, an adjustment terminal of an IC component (not shown), housed in a package 3a of the piezoelectric oscillator 3, is electrically conducted to a lid 7 made of metal, so that the lid 7 serves as an adjustment terminal.

In addition, an opening 6a is formed at an area, facing the lid 7, of the separation plate 6.

Accordingly, for example, an assembly maker can adjust the piezoelectric oscillator 3 by inserting a probe pin 9 through the opening 6a of the separation plate 6 and touching it on the lid 7 having a relatively wide area when adjusting the piezoelectric oscillator 3. As a result, the workability can be enhanced.

While the piezoelectric oscillator 3 is adjusted as described above, when a component other than the piezoelectric oscillator 3, for example, the semiconductor element 5 needs to be adjusted, the adjustment is generally carried out by the following manner. An adjustment terminal (not shown) disposed on the mounting surface of the semiconductor element 5 is electrically connected to a pad 8 disposed on the upper surface of the circuit board 2. Then, the probe pin 9 is contacted on the pad 8.

With the recent miniaturization of electronic apparatuses, the electronic module 1 mounted in them is also downsized. This downsizing forces the pad 8 to be more compact, making the workability of touching the probe pin 9 on it less efficient. In contrast, a problem arises in that making the pad 8 disposed on the circuit board 2 large for enhancing the workability gives the limitation of downsizing the electronic module 1.

SUMMARY

An advantage of the invention is to provide an electronic module including an electronic component and a piezoelectric device, in which workability of adjustment and/or inspection is improved at the time if adjusting and/or inspecting the electronic component, and downsize the module.

An electronic module according to the present invention includes: a circuit board; a piezoelectric device that has a lid and is mounted on the circuit board; and an electronic component mounted on the circuit board. The electronic component includes an adjustment terminal for adjusting and/or inspecting an electrical characteristic thereof. The lid is electrically conducted to the adjustment terminal.

The above structure allows the electronic component to be adjusted and/or inspected by electrically coupling the adjustment terminal and a probe or the like since the electronic component includes the adjustment terminal for adjusting and/or inspecting its electrical characteristic.

Here, the lid of the piezoelectric device is electrically conducted to the adjustment terminal of the electronic component. Therefore, the electronic component, other than the piezoelectric device, can be adjusted and/or inspected by touching the probe or the like to the lid of the piezoelectric device without providing a particular terminal on the circuit board for adjusting and/or inspecting the electronic component.

Consequently, the invention can provide the electronic module that enhances adjustment and/or inspection workability even when the electronic component other than the piezoelectric device is adjusted and/or inspected, and further can be downsized.

In this case, the piezoelectric device and the electronic component may be covered with a separation plate so that the lid is exposed outside.

In the structure, the piezoelectric device and the electronic component can be effectively protected from external adverse influences, since they are covered with the separation plate.

In addition, the electronic component can be easily adjusted or inspected by touching the adjustment probe or the like to the lid without removing the separation plate since the lid is exposed outside from the separation plate.

In this case, the piezoelectric device and the electronic component may be sealed with a resin so that the lid is exposed outside.

In the structure, the electronic component can be easily adjusted or inspected as well as effectively protected from external adverse influences likewise in the case of using the separation plate since they are sealed with the resin so that the lid is exposed outside.

In this case, the piezoelectric device and the electronic component may be sealed with a resin having a thickness that allows a pin-shaped member for adjusting and/or inspecting an electrical characteristic of the electronic component to touch the lid.

In the structure, the piezoelectric device and the electronic component can be effectively protected from external adverse influences since they are sealed with the resin. The lid is also sealed with the resin. Thus, they can be wholly protected from external adverse influences. Although the lid is also sealed with resin, the electronic component can be easily adjusted and inspected by touching a pin shaped member to the lid since the resin has a thickness that allows the pin-shaped member to break trough the resin to touch the lid.

In this case, the electronic module may further include an anisotropic conductive member and a metal member. The metal member may be disposed on the anisotropic conductive member so as to have an area facing to the lid, and the anisotropic conductive member may be hardened by being pressed with the metal member.

In the structure, the piezoelectric device including the lid and the electronic component are wholly sealed since they are sealed with the anisotropic conductive member. As a result, they can be wholly and effectively protected from external adverse influences.

In addition, the metal member is disposed on the anisotropic conductive member so as to have the area facing to the lid of the piezoelectric device, and the anisotropic conductive member is hardened by being pressed with the metal member. When the anisotropic conductive member is hardened, the metal member and the lid are electrically conducted with conductive particles included in the anisotropic conductive member. Thus, the electronic component can be adjusted and inspected by touching the probe or the like to the metal member on the anisotropic conductive member. The metal member, to which the probe or the like touches, can also be disposed on the anisotropic conductive member having the area larger than that of the lid so as to have an area facing the lid of the piezoelectric device. Therefore, the metal member can be disposed so that the probe or the like can be touched more easily than the cases described above.

In this case, the metal member may include at least a plurality of metal members, the adjustment terminal may include at lest a plurality of adjustment terminals, and the electronic component may include at least a plurality of electronic elements, and each metal member may correspond to each adjustment terminal of the plurality of electronic elements and be isolated each other.

In the structure, since each metal member corresponds to each adjustment terminal of the plurality of electronic components and is isolated each other, the adjustment and inspection of the plurality of electronic components can be carried out by using the plurality of metal members.

In this case, the metal member may have a marking corresponding to the adjustment terminal.

In the structure, the metal member has the marking corresponding to the adjustment terminal. Therefore, the electronic component can be adjusted and inspected by being touched with the probe or the like based on the marking even if the metal member corresponding to a specific adjustment terminal cannot be visually recognized since the piezoelectric device and the electronic component are covered with the anisotropic conductive member.

In this case, the electronic module may further include: an insulating separation plate; a terminal electrically coupling the lid, the terminal being disposed inside the insulating separation plate; and a pad electrically coupling the terminal, the pad being disposed outside the insulating separation plate.

In the structure, the terminal electrically coupling the lid is disposed inside the insulating separation plate, which protects the piezoelectric device and the electronic component from external environment, and the pad electrically coupling the terminal is disposed outside the insulating separation plate. Thus, the electronic component can be adjusted and inspected by touching the probe or the like to the pad disposed outside.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
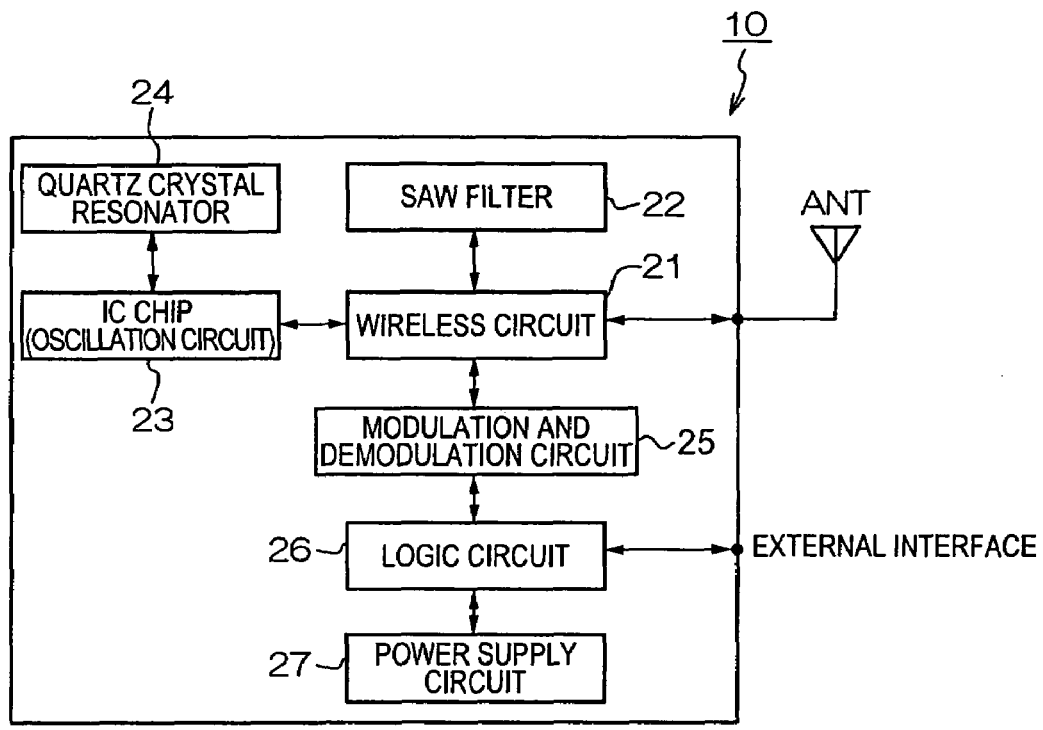
FIG. 1 is a schematic block diagram illustrating the major construction of a wireless module as an example of an electronic module according to a first embodiment of the invention.
Figure 2:
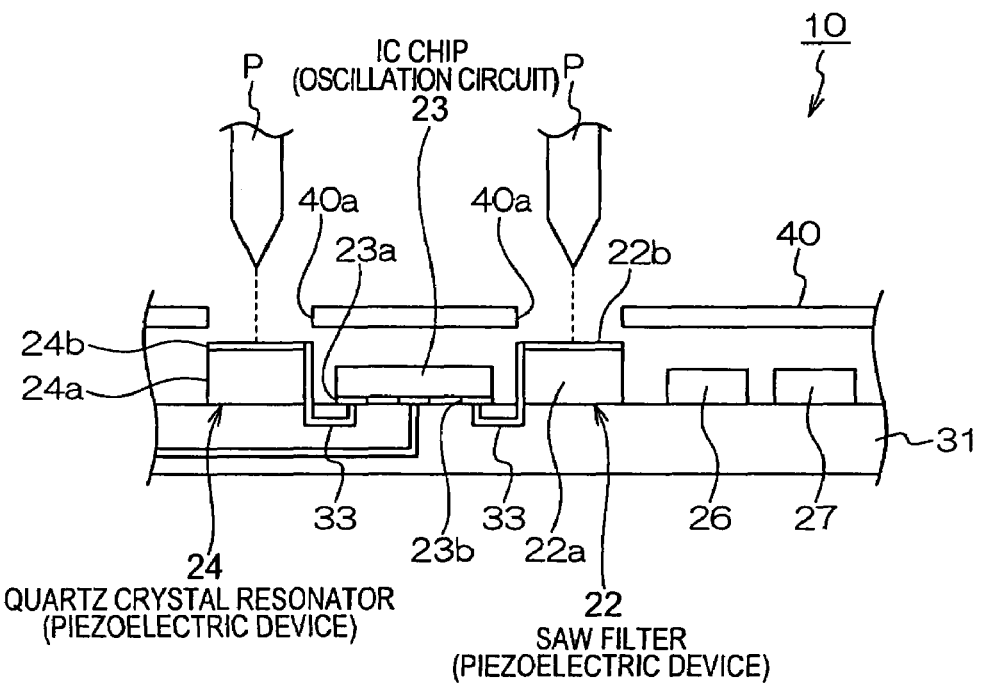
FIG. 2 is a schematic longitudinal sectional view of the electronic module of the first embodiment.

FIGS. 1 and 2 show a wireless module as an example of an electronic module 10 according to a first embodiment of the invention. FIG. 1 is a schematic block diagram illustrating the major construction of the electronic module 10. FIG. 2 is a schematic longitudinal sectional view of the electronic module 10.

In FIG. 2, only piezoelectric devices and the peripheral electronic components are illustrated, but other components included in the electronic module 10 are not shown.

In the embodiment, the electronic module 10 is an electronic apparatus that receives a predetermined radio signal from an antenna and controls the signal. As shown in FIG. 2, piezoelectric devices (a surface acoustic wave filter (hereinafter, referred to as "SAW filter") 22 and a quartz crystal resonator 24), and electronic components (an IC chip (oscillation circuit) 23, a logic circuit 26, and a power supply circuit 27) are mounted on a circuit board 31, which is exemplified as a rigid board, and a printed wiring board such as a flexible board.

Specifically, as shown in FIG. 1, a high frequency signal having weak power, which is input from the antenna (ANT), is amplified by pre-amplifier and the like included in a wireless circuit 21. The wireless circuit 21 is connected to the SAW filter 22, which is suitable for high frequency usage among piezoelectric devices. The SAW filter 22 selects a specified frequency component to amplify it.

As shown in FIG. 1, the wireless circuit 21 is also connected to the IC chip (oscillation circuit) 23.

The IC chip (oscillation circuit) 23 is connected to the quartz crystal resonator 24 serving as a piezoelectric device, and composed of at least a semiconductor element that forms a circuit to oscillate the quartz crystal resonator 24. In the embodiment, as shown in FIG. 2, the semiconductor element included in the oscillation circuit, i.e., the IC chip 23, has adjustment terminals 23a and 23b to adjust and/or inspect the electrical characteristics. Writing data through the adjustment terminals 23a and 23b allows an oscillation frequency to be adjusted so as to achieve a desired oscillation frequency. More preferably, temperature compensation data corresponding to the quartz crystal resonator 24 is written into the IC chip 23 through the adjustment terminals 23a and 23b.

As shown in FIG. 1, the wireless circuit 21 is also connected to a modulation and demodulation circuit 25, which modulates and demodulates the input-output of the wireless circuit 21 to input and output data. The modulation and demodulation circuit 25 is also connected to the logic circuit 26, which processes the input-output data of the modulation and demodulation circuit 25 to control external electronic apparatuses via external interfaces.

Theses all components are connected to the power supply circuit 27 so as to fulfill each function described above.

As shown in FIG. 2, in the SAW filter 22 and the quartz crystal resonator 24, which serve as the piezoelectric device, the main surfaces of lids 22b and 24b face upward. The lids 22b and 24b respectively seal packages 22a and 24a, each of which includes a piezoelectric resonator element (not shown), and respectively electrically conducted to the adjustment terminals 23b and 23a for adjusting and/or inspecting the electrical characteristics of the IC chip 23.

Specifically, as shown in FIG. 2, the adjustment terminals 23a and 23b are disposed on the mounting surface of the IC chip 23, connected to the pads on the circuit board 31, and electrically respectively connected to the lids 24b and 22b of the piezoelectric devices 24 and 22 through a wiring pattern 33 on the circuit board 31.

In the embodiment, the lids 24b and 22b of each piezoelectric device (the quartz crystal resonator 24 and the SAW filter 22) are electrically connected to the adjustment terminals 23a and 23b, respectively.

The structure of the lid 24b of the quartz crystal resonator 24 electrically conducted to the adjustment terminal 23a is almost same as that of the lid 22b of the SAW filter 22 electrically conducted to the adjustment terminal 23b. Thus, only the structure of the lid 24b of the quartz crystal resonator 24 electrically conducted to the adjustment terminal 23a will be described below unless specially described.

Figure 3:
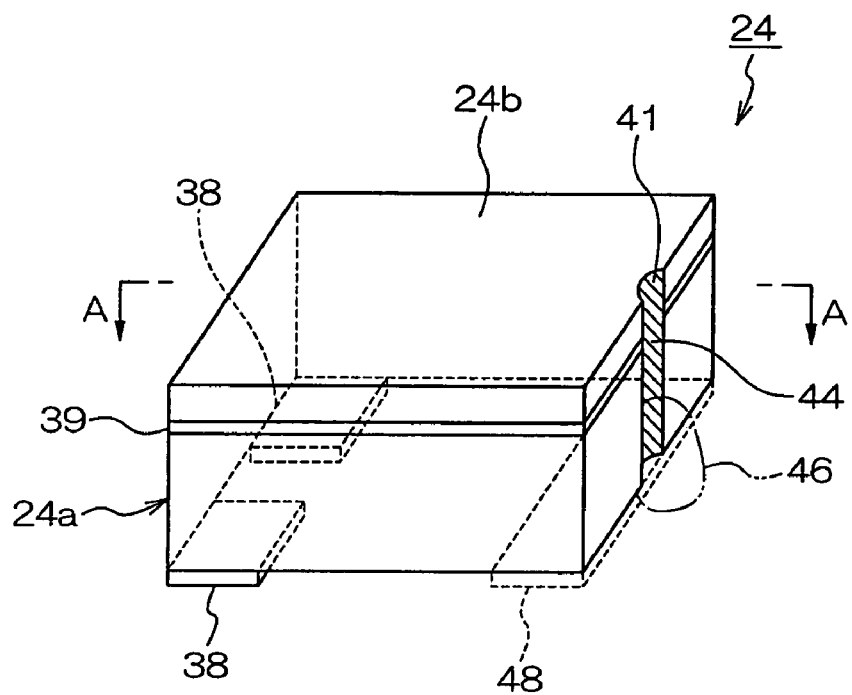
FIG. 3 is a schematic perspective view of a quartz crystal resonator, illustrating a structure in which a lid of the quartz crystal resonator serving as a piezoelectric device is electrically coupled to an adjustment terminal shown in FIG. 2.
Figure 4:
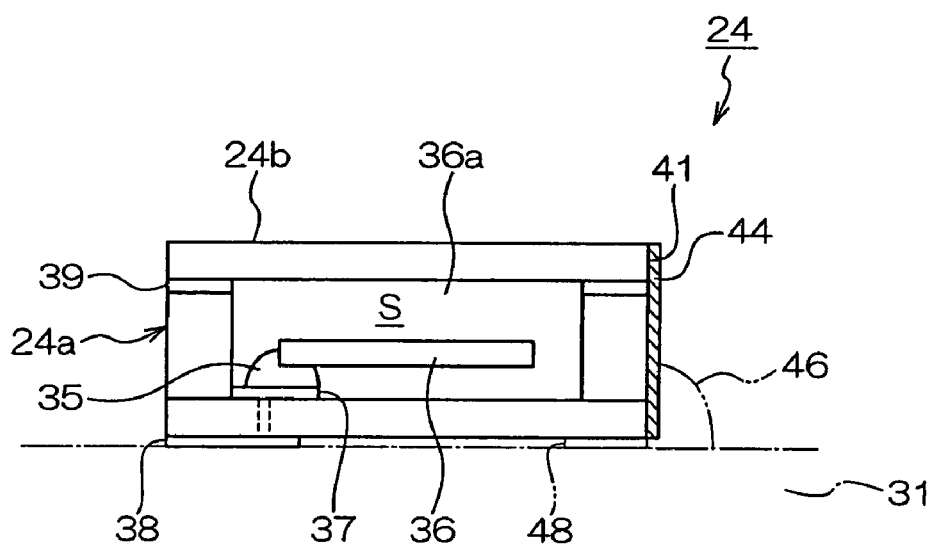
FIG. 4 is a schematic sectional view taken along the line A-A of FIG. 3.

FIGS. 3 and 4 are explanatory views illustrating a structure in which the lid 24b of the quartz crystal resonator 24 is electrically connected to the adjustment terminal 23a shown in FIG. 2. FIG. 3 is a schematic perspective view of the quartz crystal resonator 24. FIG. 4 is a schematic sectional view taken along the line A-A of FIG. 3.

As shown in FIGS. 3 and 4, the quartz crystal resonator 24 houses a piezoelectric resonator element 36 in a package 24a serving as a housing package.

The package 24a, which is a so-called surface mount package, is exemplarily formed as follows: a plurality of substrates, which are formed from ceramics green sheet made of insulation material such as aluminum oxide, is layered, and then fired to be a sintered body. The plurality of substrates having an opening at part thereof being layered, a given internal space S is formed inside. The inner space S is a space for housing the piezoelectric resonator element 36.

On the inner surface exposed in the inner space S of the package 24a, an electrode 37 is disposed that is exemplarily formed by metalized tungsten on which nickel and gold are plated in this order.

On the electrode 37, the piezoelectric resonator element 36 is mounted by applying a conductive adhesive 35, such as silicone and epoxy based ones. The electrode 37 is also electrically connected to a mounting terminal 38 disposed on the mounting surface of the package 24a through a via hole and the like.

The opening 36a opening upward of the package 24a is sealed by, for example, welding the lid 24b on the end face of the package 24b, which end face is adjacent to the opening.

In the embodiment, the lid 24b, which is wholly made of metal such as kovar (an alloy of iron, nickel, cobalt, and the like), is electrically connected to the adjustment terminal 23a (refer to FIG. 2) of the IC chip 23 as described above.

Specifically, the package 24a is provided with a concave 41 along the height direction of the sidewall. On the concave 41, disposed is an electrode pattern 44, which is exemplarily made of metalized tungsten plated with nickel and gold thereon in this order in the same manner of the electrode 37. The electrode pattern 44 is connected to the lid 24b and also connected to the wiring pattern 33 of the circuit board 31 shown in FIG. 2 with a solder 46. As a result, the lid 24b is electrically connected to the adjustment terminal 23a (refer to FIG. 2). Alternatively, the lid 24b may be electrically connected to the adjustment terminal 23a (refer to FIG. 2) by being electrically connected to a terminal 48, which is connected to the wiring pattern 33 (refer to FIG. 2), through a via hole (not shown).

In the embodiment, as shown in FIG. 2, a separation plate 40 covers piezoelectric devices (the quartz crystal resonator 24, and the SAW filter 22) and the electronic components (the IC chip 23, the logic circuit 26, and the power supply circuit 27) in order to suppress influences from external environment. The separation plate 40 has through holes 40a, each of which respectively corresponds to the lid 24b of the quartz crystal resonator 24 and the lid 22b of the SAW filter 22, so that the lids 24b and 22b are exposed outside.

The electronic module 10 according to the first embodiment of the invention is structured as described above. As shown in FIG. 2, the lid 22b of the SAW filter 22 is electrically conducted to the adjustment terminal 23b while the lid 24b of the quartz crystal resonator 24 is electrically conducted to the adjustment terminal 23a. Therefore, when the electrical characteristics of the IC chip 23 are adjusted and/or inspected, the adjustment and inspection can be carried out by contacting, for example, a probe pin P onto the lids 22b and 24b without forming any particular terminals on the circuit board 31.

In addition, the IC chip 23, which is the electronic component other than the piezoelectric devices, can be adjusted and inspected by the probe pin P easily contacted from the upper direction since the main surfaces of the lids 22b and 24b are positioned upward.

Further, the adjustment and inspection can be easily carried out by touching the probe pin P onto the lids 22b and 24b without removing the separation plate 40 since the lids 22b and 24b are exposed outside from the separation plate 40 covering the components mounted on the circuit board 31.

Figure 5:
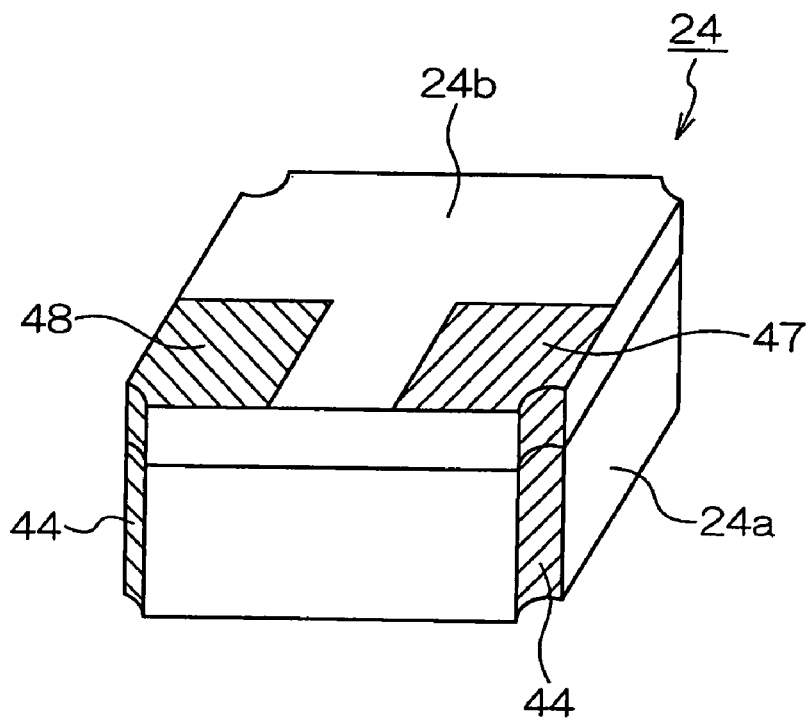
FIG. 5 is a schematic perspective view illustrating another example of the piezoelectric device of the first embodiment.

In the first embodiment, the lid 24b is wholly used for being electrically conducted to the adjustment terminal 23a in order to improve the workability of touching the probe pin P onto the lids 22b and 24b. However, an alternative way may be employed as shown in FIG. 5: the lid 24b is made of insulation material capable to transmit light, such as glass; on the upper surface, terminals 47 and 48 are formed that are electrically isolated each other; each of the terminals 47 and 48 is correspondingly electrically conducted to respective adjustment terminals 23a and 23b (refer to FIG. 2) through the electrode pattern 44 in castellations.

The piezoelectric device is not limited to the quartz crystal resonator 24 and the SAW filter 22. For example, crystal oscillators, and gyro sensors can be employed. The piezoelectric resonator element housed in the package of the piezoelectric device is also not limited to a quartz crystal resonator element, other piezoelectric materials can be used. Further, the lids 22b and 24b can be electrically conducted to adjustment/inspection terminals of other electronic components other than the IC chip 23.

Figure 6:
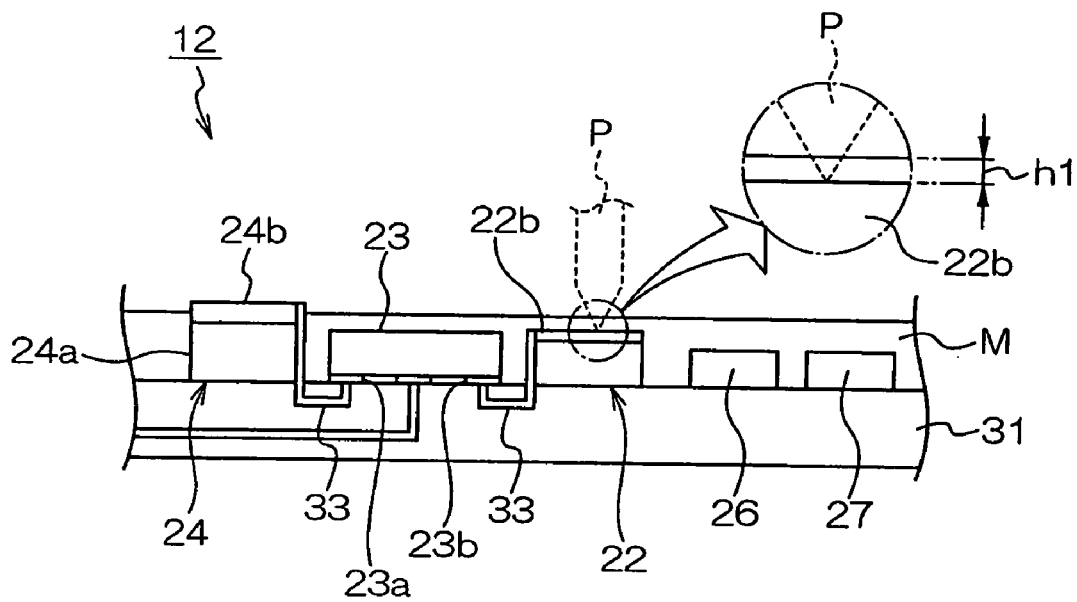
FIG. 6 is a schematic longitudinal sectional view that shows an electronic module according to a modification of the first embodiment and corresponds to FIG. 2.

FIG. 6 is a schematic longitudinal sectional view that shows an electronic module 12 according to a modification of the first embodiment and corresponds to FIG. 2.

In FIG. 6, the parts given same reference numerals of the electronic module 10 shown in FIG. 1 through 5 are common to those of the electronic module 10, and the description thereof will be omitted. Differences will be mainly described below.

The electronic module 12 according to the modification of the first embodiment differs from the first embodiment mainly in the structure of sealing the piezoelectric devices and the electronic components.

That is, the piezoelectric devices (the SAW filter 22 and the quartz crystal resonator 24) and the electronic components (the IC chip 23, the logic circuit 26, and the power supply circuit 27) are sealed with a resin M so that the lid 24b of the quartz crystal resonator 24 is exposed outside. The resin M may be insulation material such as epoxy resin and injection molded, or may be coated with a resin by screen printing. Since the sealing material is the resin M, the lid 24b of the quartz crystal resonator 24 can be easily exposed outside even if there is an electronic component taller than the quartz crystal resonator 24.

In the modification, the lid 22b of the SAW filter, one of the piezoelectric devices, is also covered with the resin M. The resin M has a thickness of h1, which allows the probe pin P for adjusting and/or inspecting the electrical characteristics of the IC chip 23 to break through the resin M to touch the lid 22b as shown by the single-dot line.

The modification of the first embodiment is structured as described above. That is, the piezoelectric devices (the quartz crystal resonator 24, and the SAW filter 22) and the electronic components (the IC chip 23, the logic circuit 26, and the power supply circuit 27) are sealed with the resin M so that the lid 24b of the quartz crystal resonator 24 is exposed outside. This structure can effectively protect them from external adverse influences, and easily adjust and inspect the IC chip 23.

The SAW filter 22 can be more effectively protected from external adverse influences since the lid 22b is also sealed with the resin M. Although the lid 22b is sealed with the resin, the IC chip 23 can easily be adjusted and inspected by touching the pin-shaped member P onto the lid 22b since the resin M has a thickness that allows the pin-shaped member P to break trough the resin M to touch the lid 22b.

Figure 7:
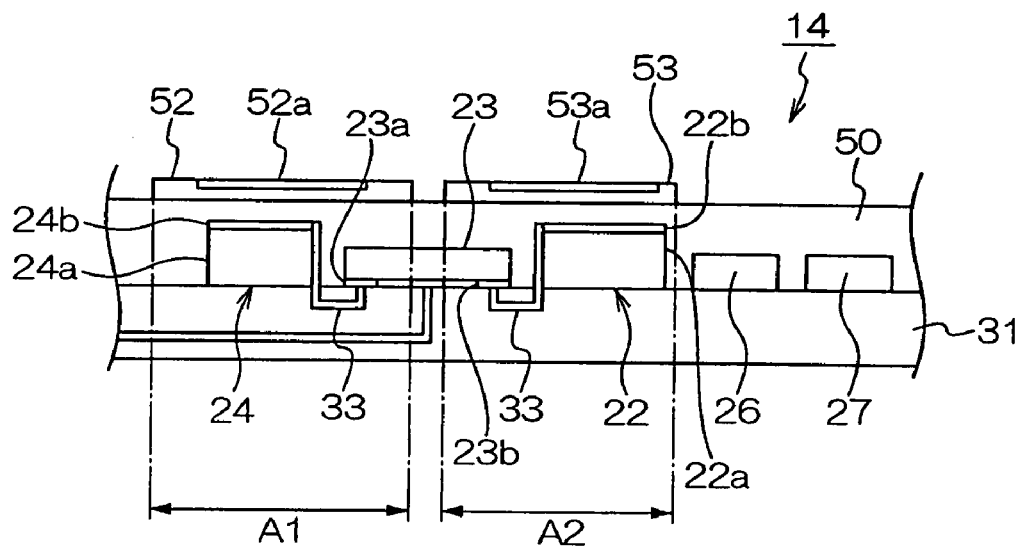
FIG. 7 is a schematic longitudinal sectional view that shows an electronic module according to a second embodiment of the invention and corresponds to FIGS. 2 and 4.

FIG. 7 is a schematic longitudinal sectional view that shows an electronic module 14 according to a second embodiment of the invention and corresponds to FIGS. 2 and 4.

In FIG. 7, the parts given same reference numerals of the electronic modules 10 and 12 shown in FIG. 1 through 6 are common to those of the electronic modules 10 and 12, and the description thereof will be omitted. Differences will be mainly described below.

The electronic module 14 according to the second embodiment differs from the first embodiment and the modification thereof mainly in the structure of electrically connecting the lid of the piezoelectric device and an adjustment member such as the probe pin.

That is, the piezoelectric devices (the SAW filter 22 and the quartz crystal resonator 24) and the electronic components (the IC chip 23, the logic circuit 26, and the power supply circuit 27) are sealed with an anisotropic conductive member 50.

As for the anisotropic conductive member 50, an anisotropic conductive adhesive having conductive fine particles (a filler) that are covered with an insulating coating and mixed into an insulating adhesive component, and an anisotropic conductive sheet are exemplarily used. The anisotropic conductive member 50 is disposed above the circuit board 31 so as to cover the piezoelectric devices (the SAW filter 22 and the quartz crystal resonator 24 including the lids 22b and 24b) and the electronic components (the IC chip 23, the logic circuit 26, and the power supply circuit 27).

In addition, on the upper surface, exposed outside, of the anisotropic conductive member 50, metal members 52 and 53 are disposed. Here, since the structures of the metal members 52 and 53 are almost same, only the metal member 52 will be described unless specially mentioned.

The metal member 52, which is exemplarily made of white metal (an alloy of nickel, copper, zinc, and the like), is disposed so as to have an area facing the upward main surface (upper surface) of the lid 24b of the piezoelectric device.

The anisotropic conductive member 50 is hardened by being pressed with the metal member 52. The metal member 52 is disposed so as to break the insulating coatings covering the conductive fine particles in the anisotropic conductive member 50 between the metal member 52 and the lid 24b when the metal member 52 is pressed toward the circuit board 31.

When the anisotropic conductive member 50 is hardened, the coatings of the conductive fine particles between the metal member 52 and the lid 24b are broken, producing electrical conduction only in the pressing direction.

The metal member 52 needs not be disposed so as to face the whole upper surface of the lid 24b, may be disposed so as to include an area not facing the lid 24b on the anisotropic conductive member 50 on condition that it is disposed so as to face part of the upper surface of the lid 24b. Since the area of the anisotropic conductive member 50 is larger than that of the upper surface of the lid 24b, the metal member 52 can be relatively freely positioned on the anisotropic conductive member 50. As a result, the degree of freedom in designing the layout of the electric module 14 in electronic apparatuses can be increased.

In the embodiment, the metal members 52 and 53 correspond to the respective adjustment terminals 23a and 23b of the IC chip 23 and are isolated each other. In other words, it is necessary to avoid shorting between the metal member 52 facing the lid 24b and the metal member 53 facing the lid 22b since the lid 22b of the SAW filter 22 and the adjustment terminal 23b of the IC chip 23 are electrically conducted while the lid 24b of the quartz crystal resonator 24 and the adjustment terminal 23a of the IC chip 23 are electrically conducted. Therefore, the metal members 52 and 53 are isolated each other so as to correspond to the lids 24b and 22b, respectively.

In addition, a marking 52a corresponding to the adjustment terminal 23a is done on the metal member 52 while a marking 53a corresponding to the adjustment terminal 23b is done on the metal member 53. As a result, the IC chip 23 can be adjusted and inspected by touching the probe or the like onto the metal members based on the markings 52a and 53a in which information on the adjustment and/or inspection is written by laser graving even if the SAW filter 22, the quartz crystal resonator 22, and the electronic components (the IC chip 23, the logic circuit 26, and the power supply circuit 27) are covered with the anisotropic conductive member 50.

The second embodiment is structured as describe above. That is, the metal members 52 and 53 are disposed on the anisotropic conductive member 50 so that each of them has an area correspondingly facing to each of the lids 22b and 24b. The anisotropic conductive member 50 is hardened by being pressed with each of the metal members 52 and 53. After the anisotropic conductive member 50 is hardened, the regions indicated by A1 and A2 in FIG. 7 become a conductive state, and the region between the regions A1 and A2 becomes a nonconductive state. Thus, the IC chip 23 can be adjusted and inspected by touching the probe or the like onto each of the metal members 52 and 53. The metal members 52 and 53 can be positioned according to a layout of the inside of the electronic module 14 since the metal members 52 and 53 are disposed on the anisotropic conductive member 50 having the area larger than that of each of the lids 22b and 24b. As a result, the probe or the like can easily be touched.

Figure 8:
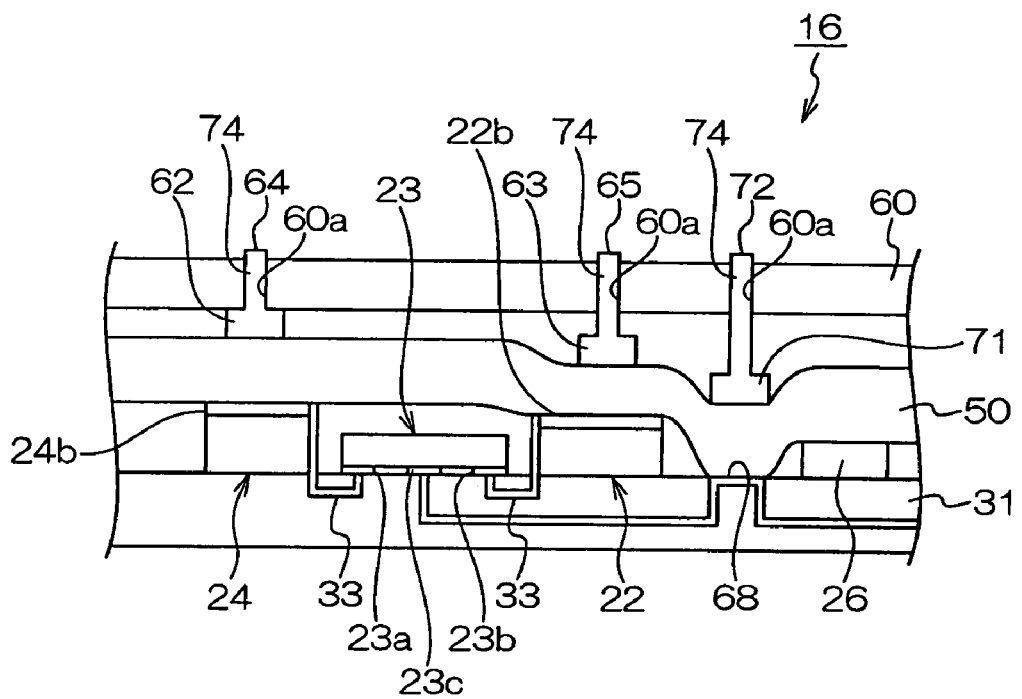
FIG. 8 is a schematic longitudinal sectional view that shows an electronic module according to a third embodiment of the invention and corresponds to FIGS. 2, 4 and 7.
Figure 9:
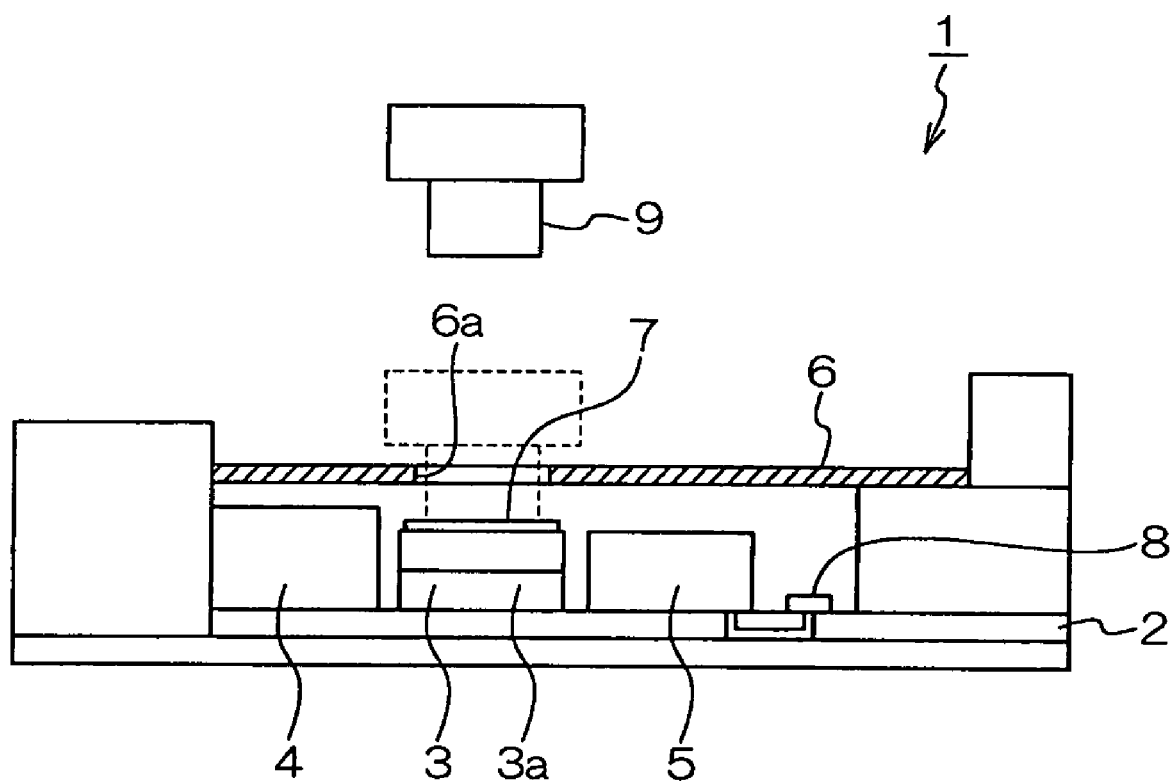
FIG. 9 illustrates an example of a related art electronic module in which components are modularized.

FIG. 8 is a schematic longitudinal sectional view that shows an electronic module 16 according to a third embodiment of the invention and corresponds to FIGS. 2, 4 and 7.

In FIG. 8, the parts given same reference numerals of the electronic modules 10, 12 and 14 shown in FIG. 1 through 7 are common to those of the electronic modules 10, 12 and 14, and the description thereof will be omitted. Differences will be mainly described below.

The electronic module 16 according to the third embodiment differs from the first and second embodiments mainly in the structure of electrically connecting the lid of the piezoelectric device and an adjustment member such as the probe pin.

That is, the piezoelectric devices (the SAW filter 22 and the quartz crystal resonator 24) and the electronic components (the IC chip 23, the logic circuit 26, and the power supply circuit 27) are covered with an insulating separation plate 60 made of epoxy resin, for example. Inside (the side adjacent to the piezoelectric device) the insulating separation plate 60, terminals 62 and 63 are disposed that are electrically connected to respective lids 24b and 22b. The separation plate 60 has through holes 60a, each corresponding to each position of the terminals 62 and 63. Outside the separation plate 60, pads 64 and 65 respectively connected to the terminals 62 and 63 are disposed through a conductive member 74 inside the through hole 60a.

In the third embodiment, the lid 22b and the terminal 63, and the lid 24b and the terminal 62 are not directly connected. Each of them is electrically connected through the anisotropic conductive member 50, such as an anisotropic conductive sheet having some elasticity.

Also, in the third embodiment, IC chip 23 has an adjustment terminal 23c in addition to the adjustment terminals 23a and 23b. The adjustment terminal 23c is electrically conducted to an electrode 68 disposed on the circuit board 31 in addition to the lid 22b of the SAW filter 22 and the lid 24b of the quartz crystal resonator 24. The electrode 68 can be electrically connected with the probe for an adjustment/inspection. That is, inside the separation plate 60, a terminal 71 electrically connected to the electrode 68 is disposed. In contrast, outside the separation plate 60, a pad 72 electrically connected to the terminal 71 is disposed.

The electronic module 16 of the third embodiment is structured described as above. That is, inside the separation plate 60, the terminals 62 and 63 electrically connected to the respective terminals 24b and 22b are disposed, while outside thereof, the pads 64 and 65 electrically connected to the respective terminals 62 and 63 are disposed. Thus, the electronic component (IC chip 23) can be adjusted and inspected by touching the probe or the like onto the pads 64 and 65 disposed outside.

Even if the number of adjustment terminals is increased, the electronic module 16 can manage unlike the second embodiment in which metal members need to be isolated each other.

In addition, even if the height differs among the lids 22b and 24b, and the electrode 68, the terminals 62, 63, 71 and the lids 24b, 22b and the electrode 68 can easily, electrically, and respectively be connected by adjusting the length of the conductive members 74, each connecting the terminals 62, 63, and 71 to the pads 64, 65, and 72, respectively, or adjusting the thickness of the anisotropic conductive sheet.

It should be understood that the invention is not limited to the above-described embodiments. The structure of each embodiment can be appropriately combined or omitted, and an additional structure not shown can also be combined therewith.

In the embodiments, the package is used that is made of ceramics and have a box shape. However, the invention also can be applied to packages or housing packages that have a shape different from the box shape and house a piezoelectric resonator element.

What is claimed is:

1. An electronic module, comprising:
   a circuit board;
   a first piezoelectric device having a first lid, the first piezoelectric device being mounted on the circuit board;
   a second piezoelectric device having a second lid, the second piezoelectric device being mounted on the circuit board; and
   an electronic component mounted on the circuit board,
   wherein the electronic component includes a first adjustment terminal and a second adjustment terminal for at least one of adjusting and inspecting an electrical characteristic thereof,
   and the first lid is electrically conducted to the first adjustment terminal and the second lid is electrically conducted to the second adjustment terminal.

2. The electronic module according to claim 1, wherein at least one of the first piezoelectric device and the second piezoelectric device and the electronic component are covered with a separation plate so that the lid of the at least one piezoelectric device is exposed outside of the separation plate.

3. The electronic module according to claim 1, wherein at least one of the first piezoelectric device and the second piezoelectric device and the electronic component are sealed with a resin so that the lid of the at least one piezoelectric device is exposed outside of the resin.

4. The electronic module according to claim 1, wherein at least one of the first piezoelectric device and the second piezoelectric device and the electronic component are sealed with a resin having a thickness that allows a pin-shaped member for at least one of adjusting and inspecting an electrical characteristic of the electronic component to touch the lid of the at least one of the first piezoelectric device and the second piezoelectric device.

5. The electronic module according to claim 1 further comprising:
   an anisotropic conductive member; and
   a metal member, wherein the metal member is disposed on the anisotropic conductive member so as to have an area facing to the lid of at least one of the first piezoelectric device and the second piezoelectric device, and the anisotropic conductive member is hardened by being pressed with the metal member.

6. The electronic module according to claim 5, wherein the metal member is a plurality of metal members, the adjustment terminal is a plurality of adjustment terminals, and the electronic component includes at is a plurality of electronic components, and each metal member corresponds to each adjustment terminal of the plurality of electronic components and is isolated from each other.

7. The electronic module according to claim 5, wherein the metal member has a marking corresponding to at least one of the first adjustment terminal and the second adjustment terminal.

8. The electronic module according to claim 1 further comprising:
   an insulating separation plate;
   a terminal electrically coupling the lid of at least one of the first piezoelectric device and the second piezoelectric device, the terminal being disposed inside the insulating separation plate; and
   a pad electrically coupling the terminal, the pad being disposed outside the insulating separation plate.

* * * * *